United States Patent
Lee et al.

(10) Patent No.: US 11,824,031 B2
(45) Date of Patent: Nov. 21, 2023

(54) SEMICONDUCTOR PACKAGE STRUCTURE WITH DIELECTRIC STRUCTURE COVERING UPPER SURFACE OF CHIP

(71) Applicant: Advanced Semiconductor Engineering, Inc., Kaohsiung (TW)

(72) Inventors: Chih-Cheng Lee, Kaohsiung (TW); Jiming Li, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 73 days.

(21) Appl. No.: 16/898,064

(22) Filed: Jun. 10, 2020

(65) Prior Publication Data
US 2021/0391291 A1    Dec. 16, 2021

(51) Int. Cl.
   *H01L 23/00*        (2006.01)
   *H01L 23/48*        (2006.01)
   *H01L 23/31*        (2006.01)

(52) U.S. Cl.
   CPC .......... *H01L 24/20* (2013.01); *H01L 23/3171* (2013.01); *H01L 23/481* (2013.01); *H01L 2924/15153* (2013.01)

(58) Field of Classification Search
   CPC ........... H01L 24/24; H01L 2924/15153; H01L 2224/04105; H01L 23/49827; H01L 23/3121; H01L 24/20; H01L 23/3171; H01L 23/481
   USPC ......... 257/676, 698, 700, E21.499, E21.505, 257/E23.178; 438/107, 118, 122, 123, 438/127
See application file for complete search history.

(56) References Cited

U.S. PATENT DOCUMENTS

| 5,171,716 A | * | 12/1992 | Cagan | ................. H01L 23/3157 257/E23.129 |
| 2004/0113260 A1 | * | 6/2004 | Sunohara | ................ H01L 24/82 257/698 |
| 2005/0100720 A1 | * | 5/2005 | Shirai | .................... H05K 3/421 428/209 |
| 2007/0069352 A1 | * | 3/2007 | Ho | ...................... H01L 23/5389 257/678 |
| 2010/0101849 A1 | * | 4/2010 | Sunohara | ............... H05K 1/185 174/260 |
| 2011/0198748 A1 | * | 8/2011 | Koike | ............... H01L 23/53238 257/E21.531 |

(Continued)

FOREIGN PATENT DOCUMENTS

JP        2003011416 A    *    1/2003

OTHER PUBLICATIONS

JP2003011416A English Machines Translation (Year: 2003).*

*Primary Examiner* — David Chen
(74) *Attorney, Agent, or Firm* — FOLEY & LARDNER LLP

(57) ABSTRACT

A semiconductor package structure and a method for manufacturing the same are provided. The semiconductor package structure includes a substrate, a chip and a dielectric structure. The substrate includes a first portion and a second portion surrounding the first portion. The second portion defines a cavity over the first portion. The chip includes a terminal on an upper surface of the chip. The dielectric structure fills the cavity and laterally encroaches over the upper surface of the chip. The dielectric structure is free from overlapping with the terminal of the chip.

6 Claims, 21 Drawing Sheets

(56) References Cited

U.S. PATENT DOCUMENTS

| | | | |
|---|---|---|---|
| 2011/0215449 A1* | 9/2011 | Camacho | H01L 23/28 |
| | | | 257/E23.116 |
| 2012/0153493 A1* | 6/2012 | Lee | H01L 24/24 |
| | | | 257/774 |
| 2012/0280407 A1* | 11/2012 | Do | H01L 21/4832 |
| | | | 257/782 |
| 2017/0103946 A1* | 4/2017 | Chang | H01L 23/5223 |
| 2017/0271266 A1* | 9/2017 | Kim | H01L 23/5383 |
| 2018/0053722 A1 | 2/2018 | Cho | |
| 2018/0090444 A1* | 3/2018 | Lee | H01L 24/20 |
| 2019/0295944 A1* | 9/2019 | Kwon | H01L 21/568 |
| 2020/0105703 A1* | 4/2020 | Kim | H01L 23/13 |
| 2020/0312757 A1* | 10/2020 | Kang | H01L 21/6835 |

* cited by examiner

SEMICONDUCTOR PACKAGE STRUCTURE WITH DIELECTRIC STRUCTURE COVERING UPPER SURFACE OF CHIP

BACKGROUND

1. Field of the Disclosure

The present disclosure relates to a semiconductor package structure, and in particular to a semiconductor package structure including a dielectric structure.

2. Description of Related Art

As semiconductor package structures develop, the integration of various elements, such as chip, becomes much more important. One of the main approaches to manufacture a semiconductor package structure with a smaller size is to embed chip into a substrate. In such a semiconductor package structure, the chip may be electrically connected to other elements through a via. However, the via with a smaller aperture and longer length may cause a greater resistance. Therefore, it is desirable to reduce the resistance in order to cater the applications requiring a smaller semiconductor package structure.

SUMMARY

According to some embodiments of the present disclosure, a semiconductor package structure includes a substrate, a chip and a dielectric structure. The substrate includes a first portion and a second portion surrounding the first portion. The second portion defines a cavity over the first portion. The chip includes a terminal on an upper surface of the chip. The dielectric structure fills the cavity and laterally encroaches over the upper surface of the chip. The dielectric structure is free from overlapping with the terminal of the chip.

According to some embodiments of the present disclosure, a semiconductor package structure includes a chip, a lead and a dielectric structure. The chip includes a terminal withdrawing from a boundary of the chip. The lead is spaced apart from the chip. The dielectric structure covers an upper surface of the lead and an upper surface of the chip at the boundary.

According to some embodiments of the present disclosure, a method for manufacturing a semiconductor package structure includes: providing a substrate, the substrate comprising a first portion and a second portion surrounding the first portion, the second portion defining a cavity over the first portion; attaching a chip on the first portion of the substrate, the chip comprising a terminal disposed on an upper surface of the chip; forming a dielectric structure filling the cavity and covering a portion of an upper surface of the chip, wherein the dielectric structure is free from overlapping with the terminal of the chip.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1:
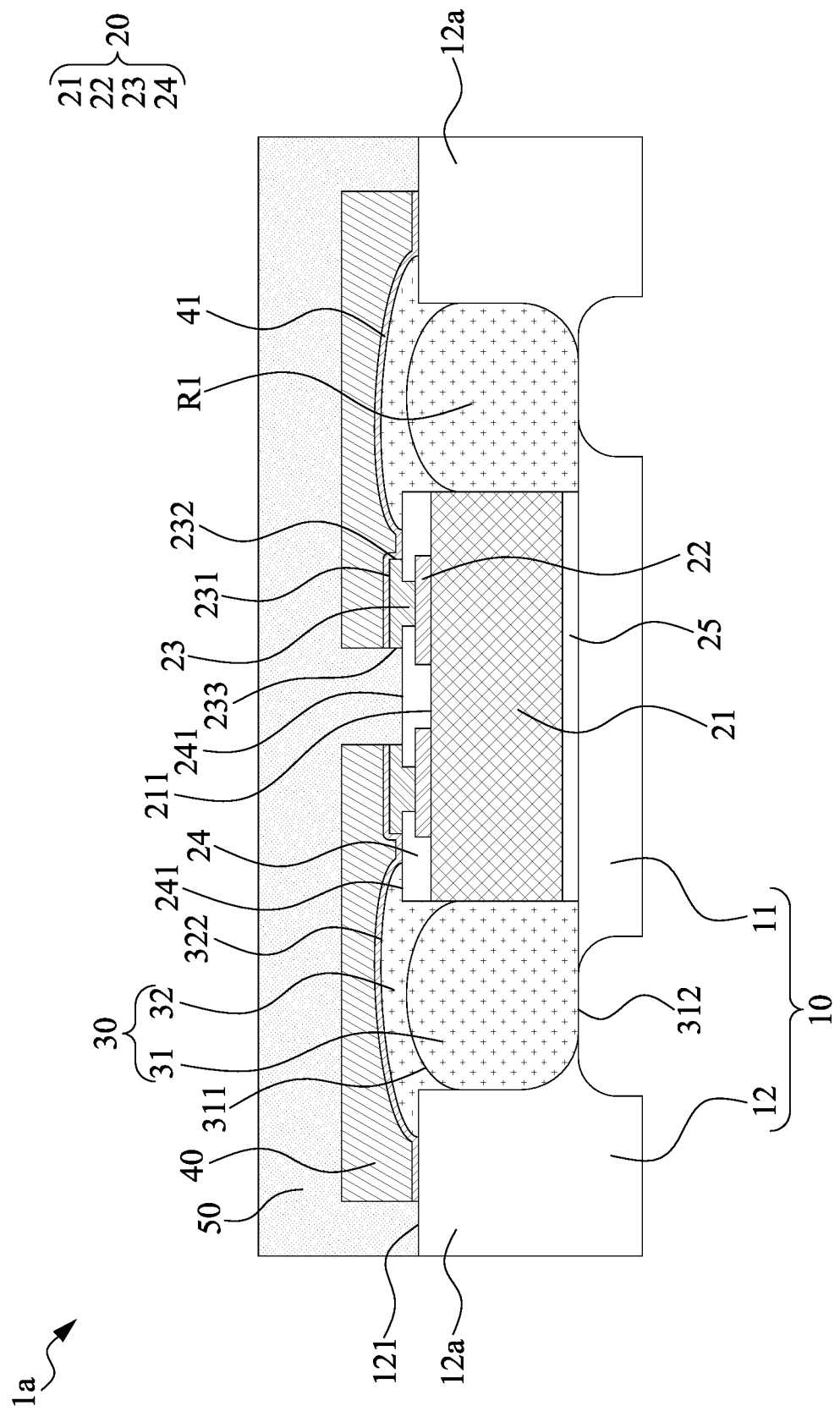
FIG. 1 is a cross-sectional view of a semiconductor package structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of a semiconductor package structure 1a in accordance with some embodiments of the present disclosure.

In some embodiments, the semiconductor package structure 1a includes a substrate 10, a chip 20, and a dielectric structure 30.

In some embodiments, the substrate 10 may be a lead frame. The substrate 10 may include metal, such as copper (Cu), silver (Ag), aluminum (Al), gold (Au), or an alloy thereof. The substrate 10 may include a first portion 11 and a second portion 12. The first portion 11 may be configured to accommodate one or more element(s), such as chip(s) or other electronic component(s). The first portion 11 may also be referred to as a die paddle of a lead frame.

The second portion 12 may include a plurality of leads 12a separated from each other. These leads 12a may surround the first portion 11. In some embodiments, the second portion 12 may be separated from the first portion 11. In some embodiments, the second portion 12 may be electrically isolated from the first portion 11.

The second portion 12 may define a recess R1 over the first portion 11. The lead 12a may define the recess R1 of the first portion 11. That is, the second portion 12 may have an elevation higher than an elevation of the first portion 11. More specifically, an upper surface, such as surface 121, of the second portion 12 may be higher than an upper surface of the first portion 11.

The chip 20 may be disposed on the first portion 11 of the substrate 10. The chip 20 may include one or more integrated circuits (ICs). In some embodiments, the chip 20 may include a power chip or other suitable electronic components. In some embodiments, the chip 20 may include, but is not limited to, at least one active component such as MEMS die or another active component. In some embodiments, the chip 20 may include, but is not limited to, at least one passive component such as a capacitor, a resistor, or another passive component. The chip 20 may include a semiconductor substrate 21, a pad 22, a terminal 23 and a passivation layer 24.

The semiconductor substrate 21 may be disposed on the first portion 11. The semiconductor substrate 21 may include silicon (Si), doped Si, silicon carbide (SiC), germanium silicide (SiGe), gallium arsenide (GaAs), or other semiconductor materials. The semiconductor substrate 21 may include a surface 211. The surface 211 may be an active surface. That is, some active and/or passive elements may be disposed adjacent to the surface 211. The surface 211 may also be referred to as an upper surface of the semiconductor substrate 21.

The pad 22 may be disposed on the semiconductor substrate 21. The pad 22 may be electrically connected to the active and/or passive elements in the semiconductor substrate 21. The pad 22 may include a conductive material. In some embodiments, the chip 20 may include aluminum (Al).

The terminal 23 may be disposed on the pad 22. The terminal 23 may be electrically connected to the pad 22. The terminal 23 may include a conductive material. In some embodiments, the terminal 23 may include Cu. The terminal 23 may include a surface 231, a surface 232 and a surface 233. The surface 232 or 233 may substantially be orthogonal to the surface 231, respectively. In some embodiments, the surface 231 may have an elevation higher than the elevation of the surface 121 of the second portion 12. The surface 231 may also be referred to as an upper surface of the terminal 23. The surface 232 or 233 may also be referred to as a side surface of the terminal 23, respectively.

The passivation layer 24 may be disposed on the surface 211 of the semiconductor substrate 21. The passivation layer 24 may cover the pad 22. The terminal 23 may be exposed from the passivation layer 24. The passivation layer 24 may cover the surface 211 of the semiconductor substrate 21. The passivation layer 24 may include a dielectric material, such as silicon nitride, silicon oxide, silicon oxynitride or other suitable materials. The passivation layer 24 may include a surface 241. The surface 241 may also be referred to as an upper surface of the passivation layer 24. The surface 241 of the passivation layer 24, the surface 231 of the terminal 23 or the surface 211 of the semiconductor substrate 21 may be defined as an upper surface of the chip 20. In some embodiments, a side surface of the passivation layer 24 is not hanging over the recess R1. In some embodiments, a side surface of the passivation layer 24 is vertically aligned with a side surface of the semiconductor substrate 21.

The chip 20 may be attached to the first portion 11 through an adhesive film 25. The adhesive film 25 may include die attach film (DAF) or other suitable materials.

The dielectric structure 30 may fill the recess R1. In some embodiments, the dielectric structure 30 may be disposed between the second portion 12 of the substrate 10 and the chip 20. In some embodiments, the dielectric structure 30 may laterally encroach over the surface 211 of the chip 20. In some embodiments, the dielectric structure 30 may cover a portion of the surface 241 of the passivation layer 24. In some embodiments, the dielectric structure 30 is free from overlapping with the terminal 23 of the chip 20. That is, the dielectric structure 30 may be spaced apart from the terminal 23 of the chip 20. The dielectric structure 30 may cover a portion of the surface 121 of the second portion 12. The dielectric structure 30 may include resin or other suitable materials.

In some embodiments, the dielectric structure 30 may include a first dielectric layer 31 and a second dielectric layer 32. The first dielectric layer 31 and the second dielectric layer 32 may be made of the same or similar materials but formed in different steps such that an interface is formed between the first dielectric layer 31 and the second dielectric layer 32. In some embodiments, the interface between the first dielectric layer 31 and the second dielectric layer 32 may be a curved surface. In some embodiments, the interface between the first dielectric layer 31 and the second dielectric layer 32 may be a concave surface. In some embodiments, the second dielectric layer 32 may be concave with respect to the first dielectric layer 31.

The first dielectric layer 31 may be disposed between the second portion 12 of the substrate 10 and the chip 20. The first dielectric layer 31 may surround the chip 20 from a top view perspective. In some embodiments, the first dielectric layer 31 may have a curved surface, such as surface 311. The first dielectric layer 31 may have a surface 311 and a surface 312. In some embodiments, a portion of the surface 311 may have an elevation higher than an elevation of the surface 211. In some embodiments, a portion of the surface 311 may have an elevation lower than the elevation of the surface 211. The surface 311 may also be referred to as an upper surface of the first dielectric layer 31.

In some embodiments, the surface 312 may be exposed from the substrate 10. In some embodiments, the surface 312 may be exposed to air. In some embodiments, The surface 312 may have an elevation substantially the same the elevation of the upper surface of the first portion 11. The surface 312 may also be referred to as a lower surface of the first dielectric layer 31.

The second dielectric layer 32 may be disposed on the first dielectric layer 31. In some embodiments, the second dielectric layer 32 may cover the surface 121 of the second portion 12. In some embodiments, the second dielectric layer 32 may cover the surface 241 of the passivation layer 24. In some embodiments, the second dielectric layer 32 may cover the surface 211 of the semiconductor substrate 21. In some embodiments, the second dielectric layer 32 may laterally encroach over the surface 121 of the second portion 12. In some embodiments, the second dielectric layer 32 may laterally encroach over the upper surface of the passivation layer 24. In some embodiments, the second dielectric layer 32 may laterally encroach over the upper surface of the chip 20. In some embodiments, the second dielectric layer 32 may be spaced apart from the terminal 23 of the chip 20.

The semiconductor package structure 1a may further include a redistribution structure 40. The redistribution structure 40 may be disposed on the second portion 12 of the substrate 10, the dielectric structure 30, and the chip 20. The redistribution structure 40 may be electrically connected to the chip 20. The redistribution structure 40 may be electrically connected to the second portion 12 of the substrate 10. The redistribution structure 40 may cover the surface 121 of the second portion 12 of the substrate 10. The redistribution structure 40 may cover the dielectric structure 30. The redistribution structure 40 may cover the chip 20. In some embodiments, the redistribution structure 40 may be in contact with the passivation layer 24. In some embodiments, the redistribution structure 40 may be in contact with the surface 231 of the terminal 23. In some embodiments, the redistribution structure 40 may be in contact with the surface 232 of the terminal 23. In some embodiments, the surface 233 of the terminal 23 may be exposed from the redistribution structure 40. In some embodiments, a portion of the redistribution structure 40 is disposed between the terminal 23 and dielectric structure 30. More specifically, a portion of the redistribution structure 40 is disposed between the terminal 23 and second dielectric layer 32 of the dielectric structure 30. In some embodiments, a portion of the redistribution structure 40 is laterally spacing the second portion 12 of the substrate 10 and the terminal 23 of the chip 20. The redistribution structure 40 may include conductive material, such as Cu, Ag, Al, Au, or an alloy thereof.

The redistribution structure 40 may include a seed layer 41. In some embodiments, the seed layer 41 may be conformally disposed on the second portion 12, the second dielectric layer 32, the passivation layer 24 and the terminal 23. In some embodiments, the seed layer 41 may be in contact with the passivation layer 24. In some embodiments, the seed layer 41 may be in contact with the terminal 23. In some embodiments, the seed layer 41 may be in contact with the surface 231 of the terminal 23. In some embodiments, the seed layer 41 may completely cover the surface 231 of the terminal 23. In some embodiments, the seed layer 41 may be in contact with at least one side surface of the terminal 23. That is, the seed layer 41 may be in contact with the surface 232 of the terminal 23, and the surface 233 of the terminal 23 is exposed from the seed layer 41. In some embodiments, the seed layer 41 may continuously extend from the surface 232 to the surface 231 of the terminal 23. The seed layer 41 may be formed of, for example, Cu, tin (Sn), stainless steel, another metal or metal alloy, or a combination thereof.

The semiconductor package structure 1a may further include an encapsulant 50. The encapsulant 50 may cover the second portion 12 of the substrate 10, the second dielectric layer 32 and the chip 20. In some embodiments, the encapsulant 50 may be in contact with a portion of the passivation layer 24. In some embodiments, the encapsulant 50 may be in contact with the surface 233 of the terminal 23. The encapsulant 50 may include a Novolac-based resin, an epoxy-based resin, a silicone-based resin, or another suitable material.

In some embodiments, the dielectric structure 30 is formed without formation of a via such that the redistribution structure 40 may be electrically connected to the terminal without the via. Conventionally, a via is implemented by performing a patterning technique (e.g., laser drilling, photolithography operations) on a dielectric layer, and filling conductive material in order to electrically connect a conductive pad of a semiconductor chip to a redistribution structure. The via so formed may posses a small dimension (e.g., diameter) hence an increased electrical resistance. For power chip application which demands high current and high voltage, the aforesaid via with small dimension inevitably deteriorate the electrical performance of the power chip.

Some embodiments in the present disclosure provides a semiconductor package structure suitable for power chip application with better electrical performance. In some embodiments as shown in FIG. 1, the aforesaid via is not implemented. The dielectric structure 30 should provides a sufficient height allowing the redistribution structure 40 and/or seed layer 41 to cover the upper surface of the second portion 12 of the substrate 10 and the upper surface of the chip 20. In some embodiments, the dielectric structure 30 includes the first dielectric layer 31 and the second dielectric layer 32 that are formed in different steps. The application of the second dielectric layer 32 eliminates the wedge (e.g., a dimple) formed at the top surface of the first dielectric layer 31 adjacent to the side surface of the chip 20 after forming the first dielectric layer 31. In another comparative semiconductor package structure, there are wedges formed between a dielectric structure and a chip, resulting in voids formation during subsequent operations such as electroplating a redistribution layer. In the present disclosure, the semiconductor package structure 1a may be free of voids when completing the electroplating of the redistribution layer 40.

Figure 2:
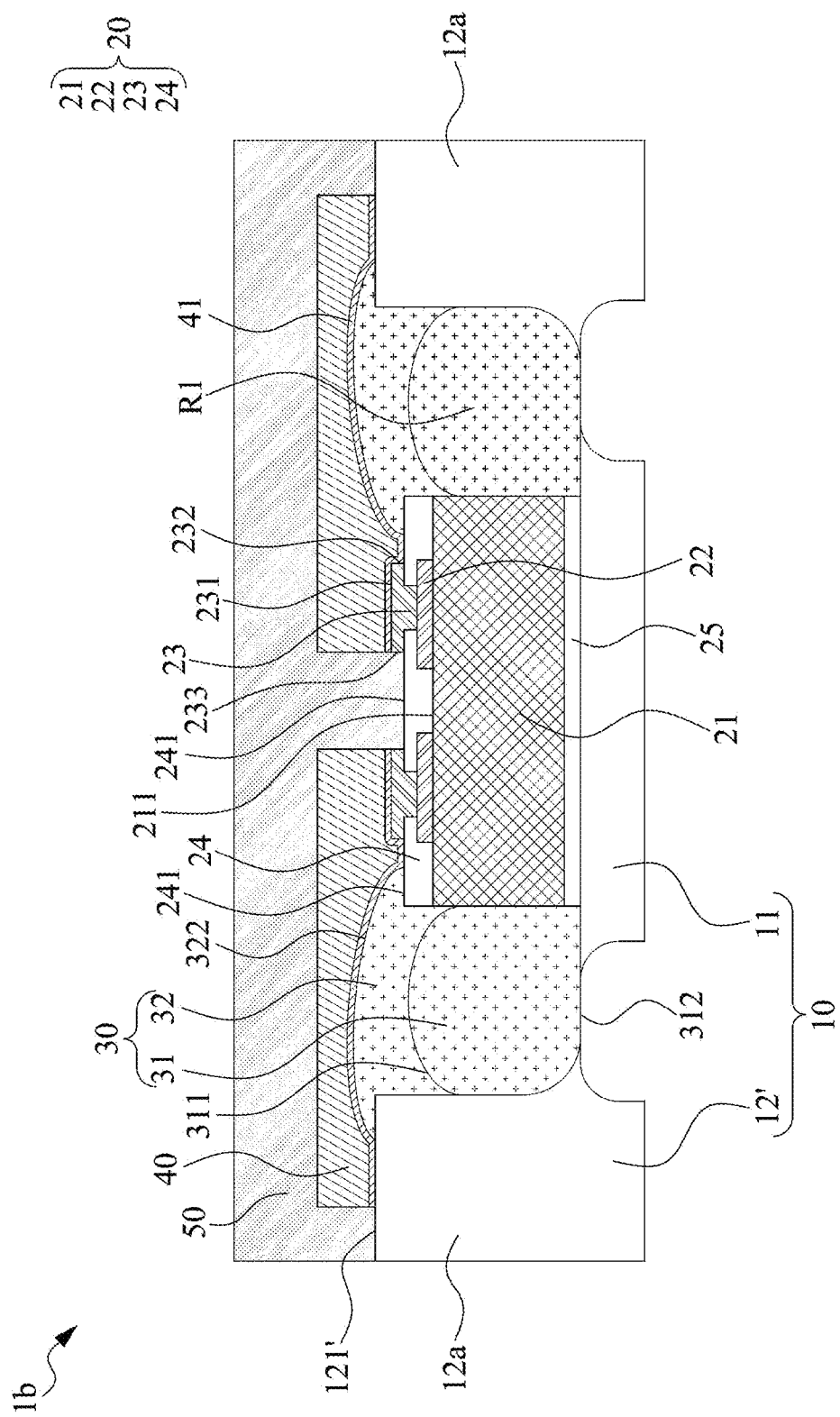
FIG. 2 is a cross-sectional view of a semiconductor package structure in accordance with some embodiments of the present disclosure.

FIG. 2 is a cross-sectional view of a semiconductor package structure 1b in accordance with some embodiments of the present disclosure. The semiconductor package structure 1b of FIG. 2 has a structure similar to that of the semiconductor package structure 1a of FIG. 1 except that the surface 121' of the second portion 12' of the semiconductor package structure 1b has an elevation higher than the elevation of the surface 231.

Figure 3:
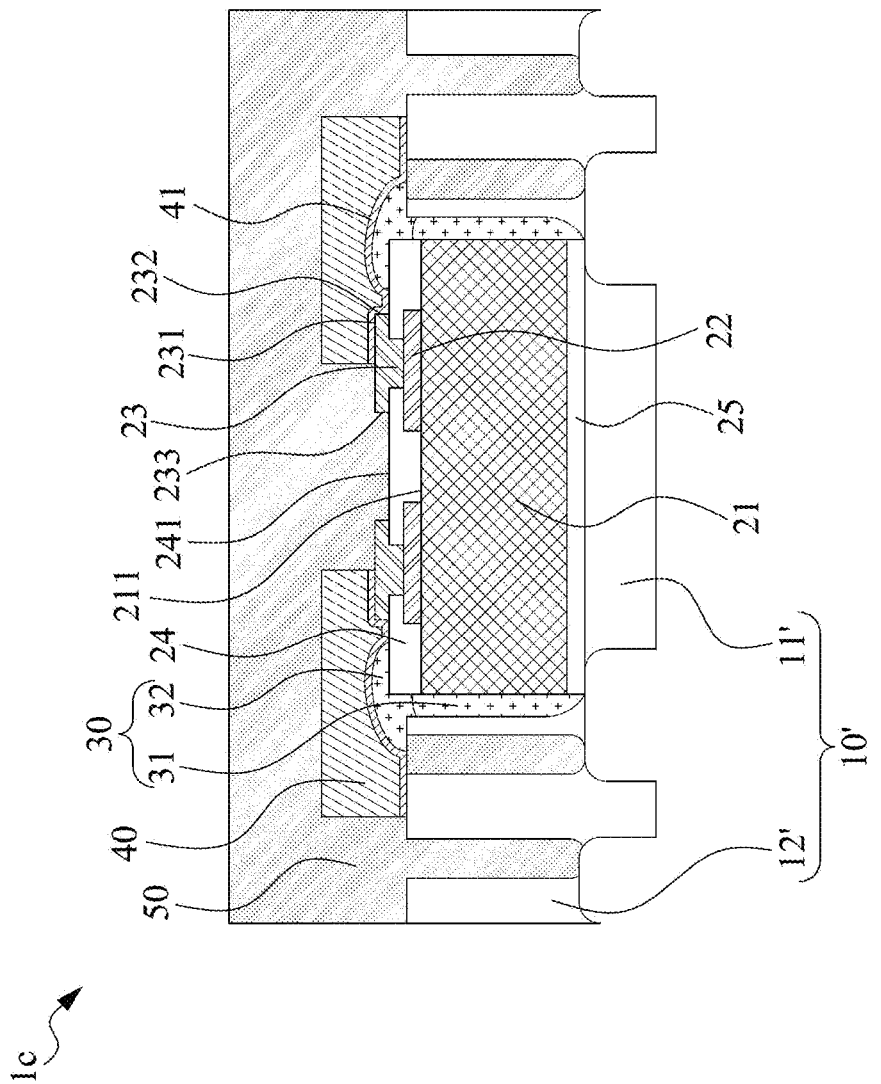
FIG. 3 is a cross-sectional view of a semiconductor package structure in accordance with some embodiments of the present disclosure.

FIG. 3 is a cross-sectional view of a semiconductor package structure 1c in accordance with some embodiments of the present disclosure. The semiconductor package structure 1c of FIG. 3 has a structure similar to that of the semiconductor package structure 1a of FIG. 1 except that the substrate 10' is a pre-mold lead frame.

The substrate 10' may include a first portion 11' and a second portion 12'. The first portion 11' may be configured to accommodate the chip 20. The first portion 11' may also be referred to as a die paddle of the substrate 10'.

The second portion 12' may define multiple openings filled by the encapsulant 50. These openings may have a ring-shape in a top view. In some embodiments, the encapsulant 50 may be exposed from the openings defined by the second portion 12'.

In some embodiments, a portion of the surface 231 of the terminal 23 may be exposed from the redistribution structure 40. In some embodiments, the encapsulant 50 may be in contact with a portion of the surface 231 of the terminal 23.

Figure 4:
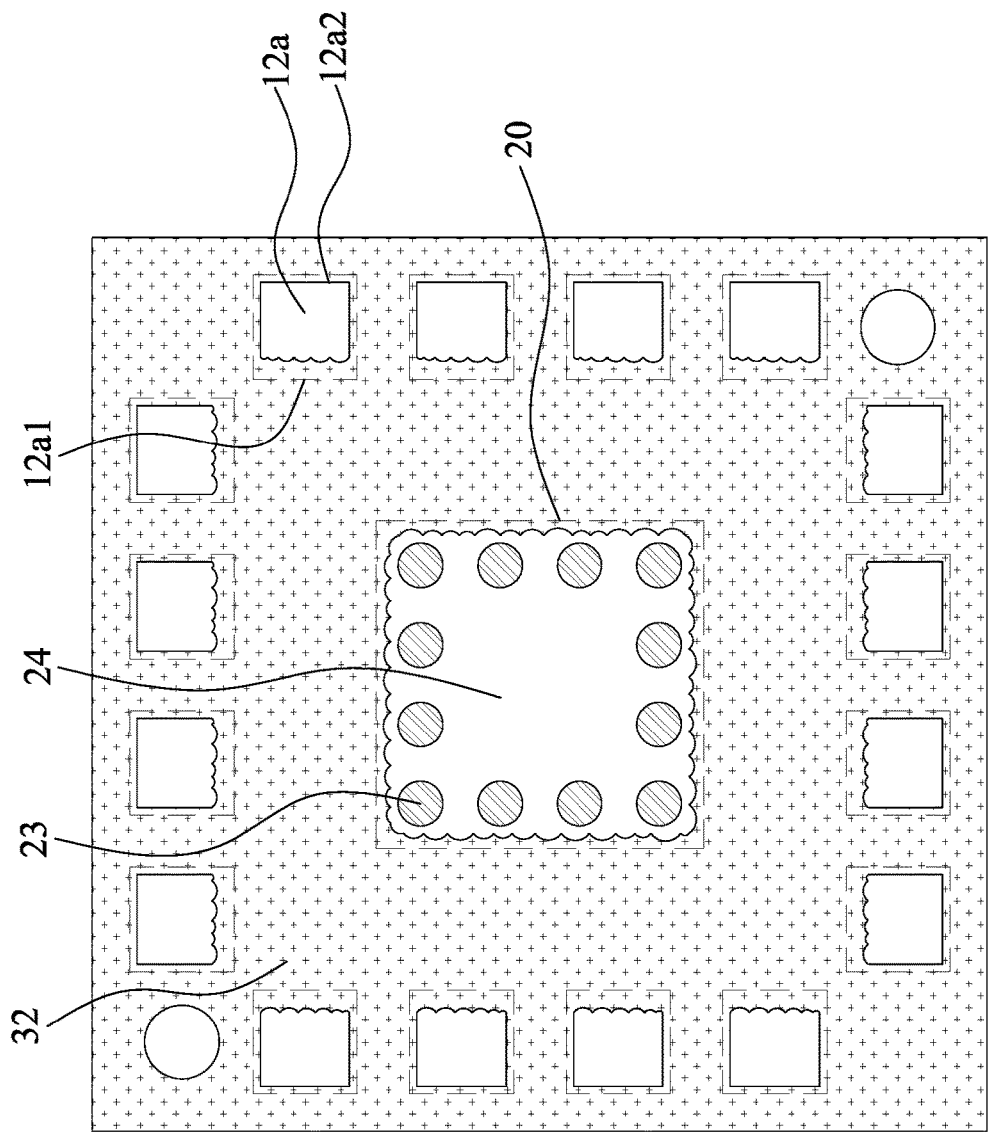
FIG. 4 is a top view of a semiconductor package structure in accordance with some embodiments of the present disclosure.

FIG. 4 is a top view of a semiconductor package structure 1a in accordance with some embodiments of the present disclosure. It is appreciated that some elements, such as the redistribution structure 40 and the encapsulant 50, are omitted for brevity.

From a top view perspective, the semiconductor package structure 1a may include a plurality of leads 12a separated from each other. Each of the lead 12a is spaced apart from the chip 20. The leads 12a may surround the chip 20. In some embodiments, the upper surface of the lead 12a is covered by the second dielectric layer 32. The lead 12a has a side 12a1 and a side 12a2. The side 12a1 faces toward the chip 20. The side 12a2 is opposite to the side 12a1. In some embodiments, the side 12a1 is covered by the second dielectric layer 32. More specifically, the second dielectric layer 32 encroaching over the lead 12a through the side 12a1 is more prominent than through the side 12a2. In some embodiments, the second dielectric layer 32 covers a portion of the lead 12a and expose an irregular pattern at the upper surface of the lead 12a.

The chip 20 includes a plurality of terminals 23 exposed from the passivation layer 24. The terminal 23 may withdraw from a boundary of the chip 20. In some embodiments, the second dielectric layer 32 covers an upper surface of the chip 20 at the boundary. In some embodiments, the second dielectric layer 32 covers the upper surface of the chip 20 with a continuous irregular boundary. More specifically, the second dielectric layer 32 covers a peripheral region of the passivation layer 24 of the chip 20, and a central region of the chip 20 is exposed from the second dielectric layer 32. In some embodiments, the terminals 23 are free from overlapping the second dielectric layer 32.

FIG. 5A, FIG. 5B, FIG. 5C and FIG. 5D are top views of a portion of a semiconductor package structure in accordance with some embodiments of the present disclosure. FIG. 5A, FIG. 5B, FIG. 5C and FIG. 5D illustrate different designs between the terminal 23, the dielectric structure 30, the lead 12a and the redistribution structure 40 in accordance with some embodiments.

Figure 5D:
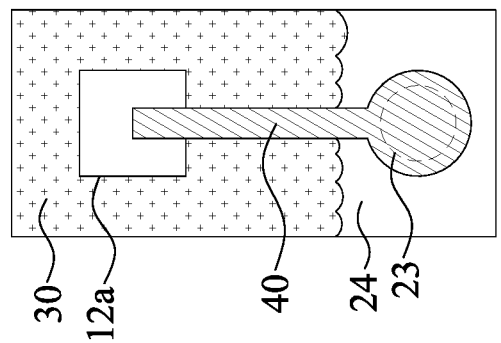
FIG. 5D is a top view of a portion of a semiconductor package structure in accordance with some embodiments of the present disclosure.
Figure 5C:
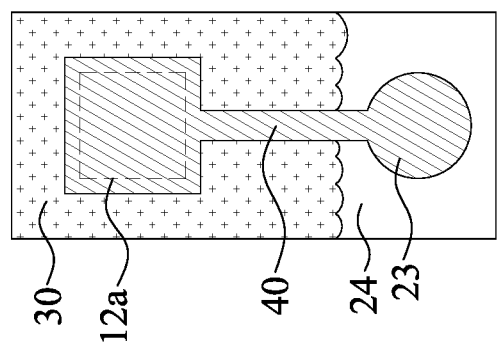
FIG. 5C is a top view of a portion of a semiconductor package structure in accordance with some embodiments of the present disclosure.
Figure 5B:
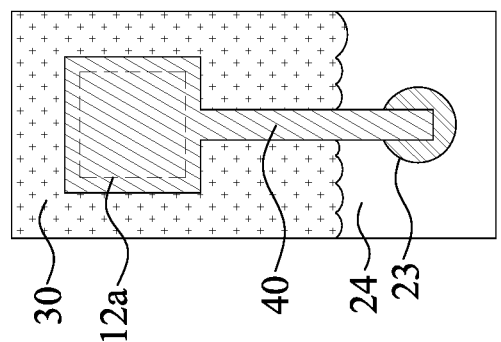
FIG. 5B is a top view of a portion of a semiconductor package structure in accordance with some embodiments of the present disclosure.
Figure 5A:
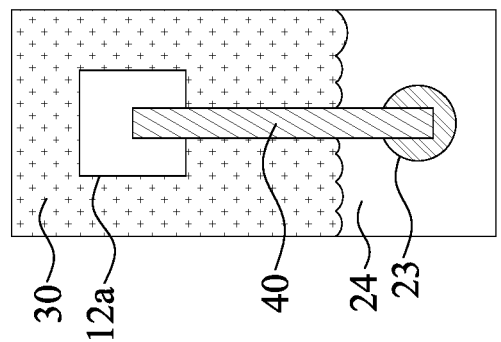
FIG. 5A is a top view of a portion of a semiconductor package structure in accordance with some embodiments of the present disclosure.

Referring to FIG. 5A, in some embodiments, the redistribution structure 40 may cover a portion of the upper surface of the lead 12a, and a portion of the upper surface of the lead 12a is exposed from the redistribution structure 40. In some embodiments, the redistribution structure 40 may cover a portion of the upper surface of the terminal 23, and a portion of the upper surface of the terminal 23 is exposed from the redistribution structure 40.

Referring to FIG. 5B, in some embodiments, the redistribution structure 40 may completely cover the upper surface of the lead 12a. In some embodiments, the redistribution structure 40 may cover a portion of the upper surface of the terminal 23, and a portion of the upper surface of the terminal 23 is exposed from the redistribution structure 40.

Referring to FIG. 5C, in some embodiments, the redistribution structure 40 may completely cover the upper surface of the lead 12a. In some embodiments, the redistribution structure 40 may completely cover the upper surface of the terminal 23.

Referring to FIG. 5D, in some embodiments, the redistribution structure 40 may cover a portion of the upper surface of the lead 12a, and a portion of the upper surface of the lead 12a is exposed from the redistribution structure 40. In some embodiments, the redistribution structure 40 may completely cover the upper surface of the terminal 23.

FIG. 6A, FIG. 6B, FIG. 6C, FIG. 6D, FIG. 6E and FIG. 6F illustrate various stages of a method for manufacturing a semiconductor package structure 1a in accordance with some embodiments of the present disclosure.

Figure 6A:
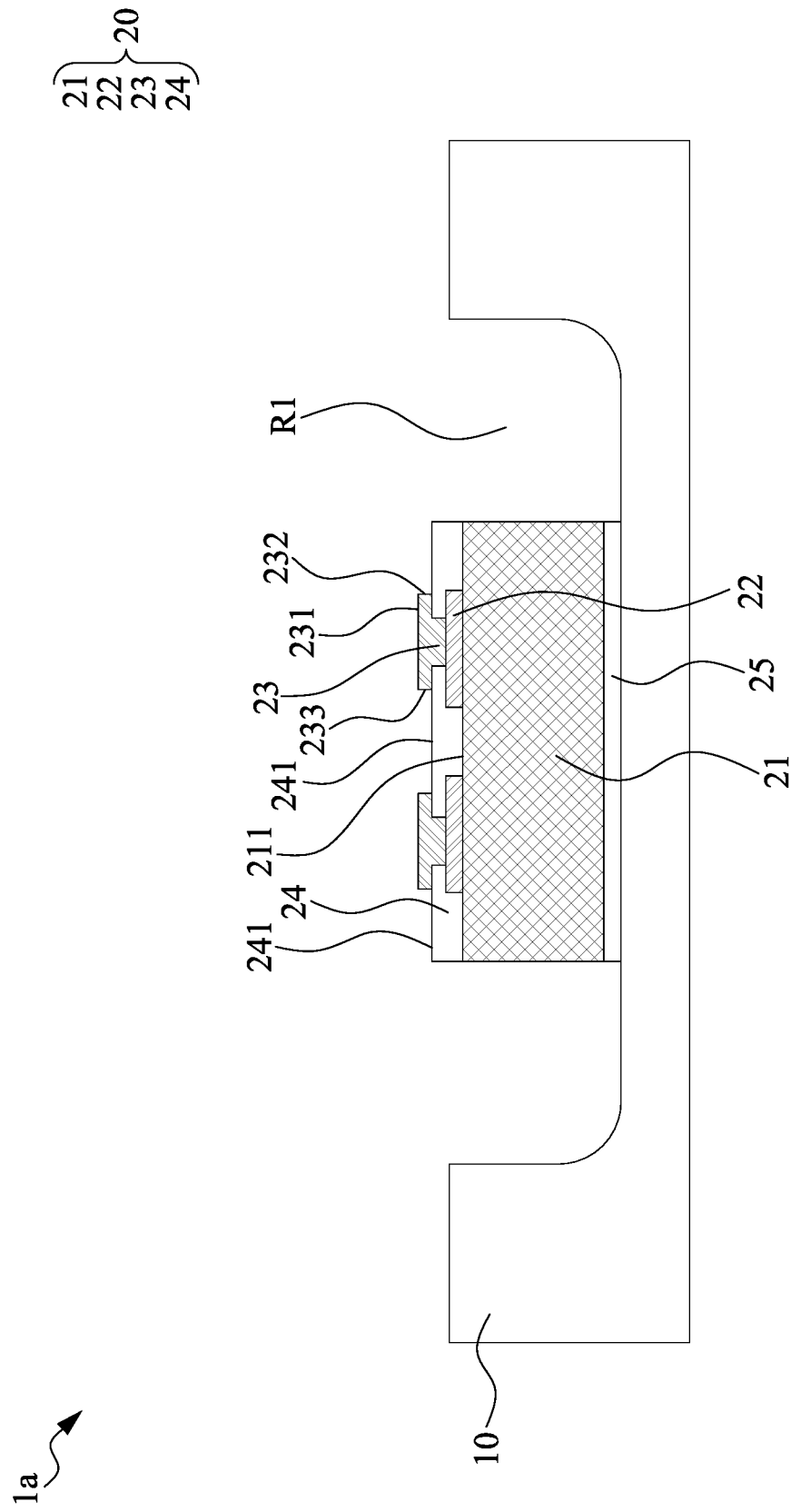
FIG. 6A, FIG. 6B, FIG. 6C, FIG. 6D, FIG. 6E and FIG. 6F illustrate various stages of a method for manufacturing a semiconductor package structure in accordance with some embodiments of the present disclosure.

Referring to FIG. 6A, a substrate 10 is provided. The substrate 10 may include a recess R1. A chip 20 may be attached to the substrate 10 by an adhesive film. The chip 20 may be disposed corresponding to the recess R1 of the substrate 10.

Figure 6B:
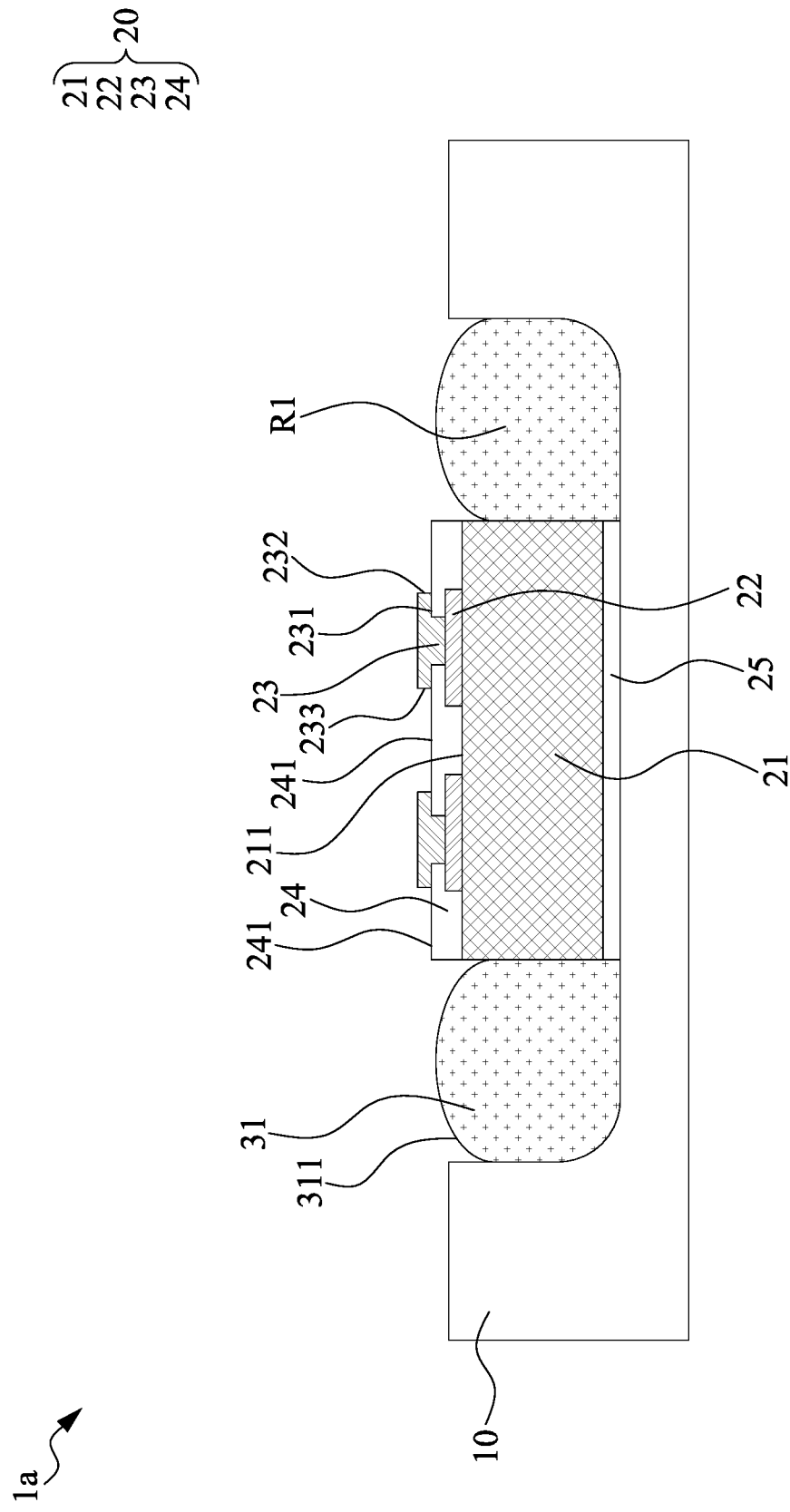

Referring to FIG. 6B, a first dielectric layer 31 is filled into the recess R1 of the substrate 10. More specifically, the first dielectric layer 31 is filled into the space between the substrate 10 and the chip 20. In some embodiments, the first dielectric layer 31 may be formed by a screen printing process or a dispensing process. In a screen printing process, a stencil with openings is provided. The openings may correspond to the space into which the first dielectric layer 31 is filled. In some embodiments, a resin material may be filled into the recess R1 through the openings of the stencil, and a curing process is performed to cure the resin material to form first dielectric layer 31.

Figure 6C:
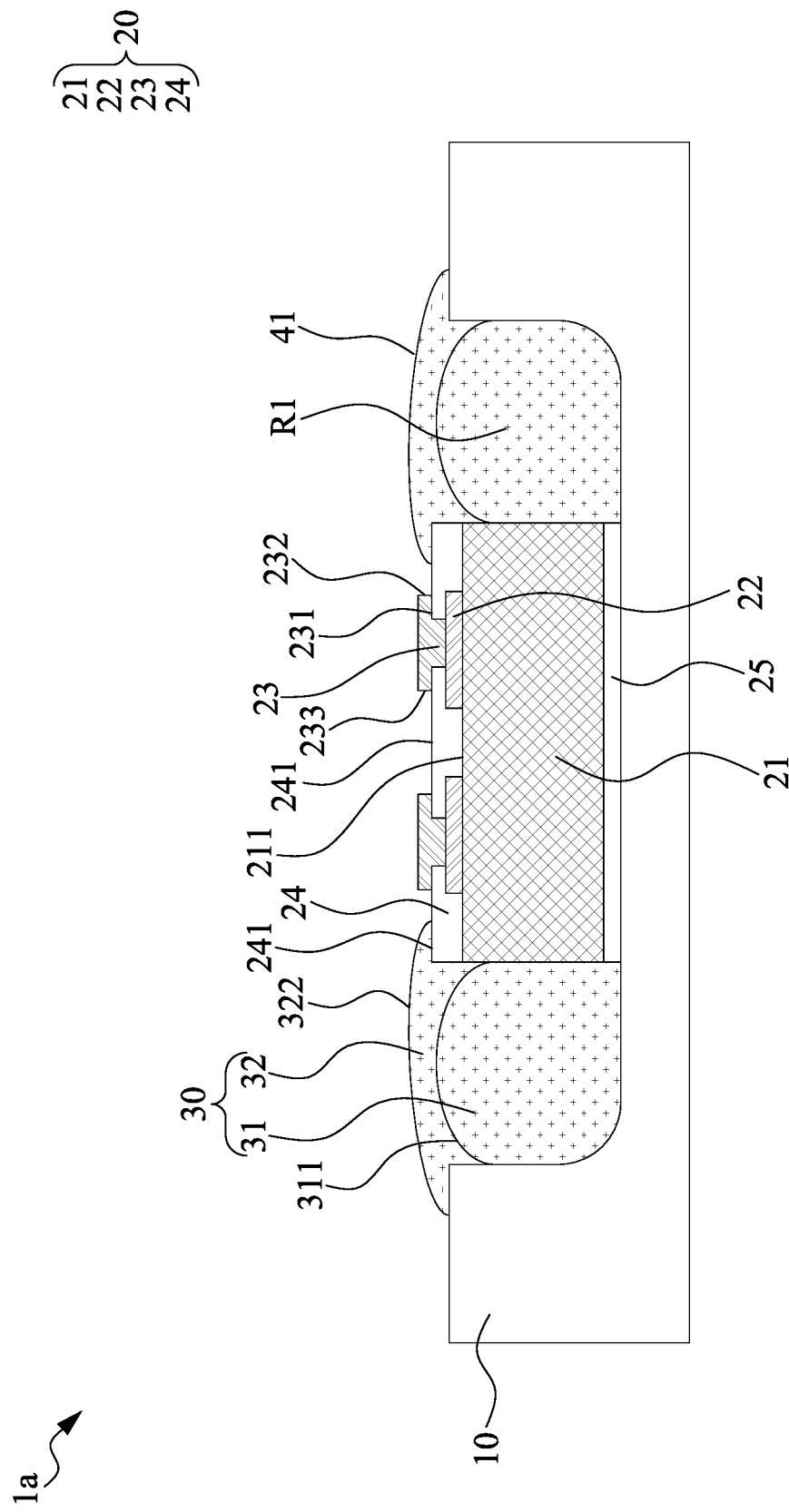

Referring to FIG. 6C, a second dielectric layer 32 is formed over the first dielectric layer 31. In some embodiments, the second dielectric layer 32 may be formed by a dispensing process. In some embodiments, after the first dielectric layer 31 is formed, a resin material may be dispensed over the upper surface of the substrate 10, the first dielectric layer 31 and the passivation layer 24. Next, a curing process is performed to cure the resin material to from the second dielectric layer 32. An interface may be formed between the first dielectric layer 31 and the second dielectric layer 32.

Figure 6D:
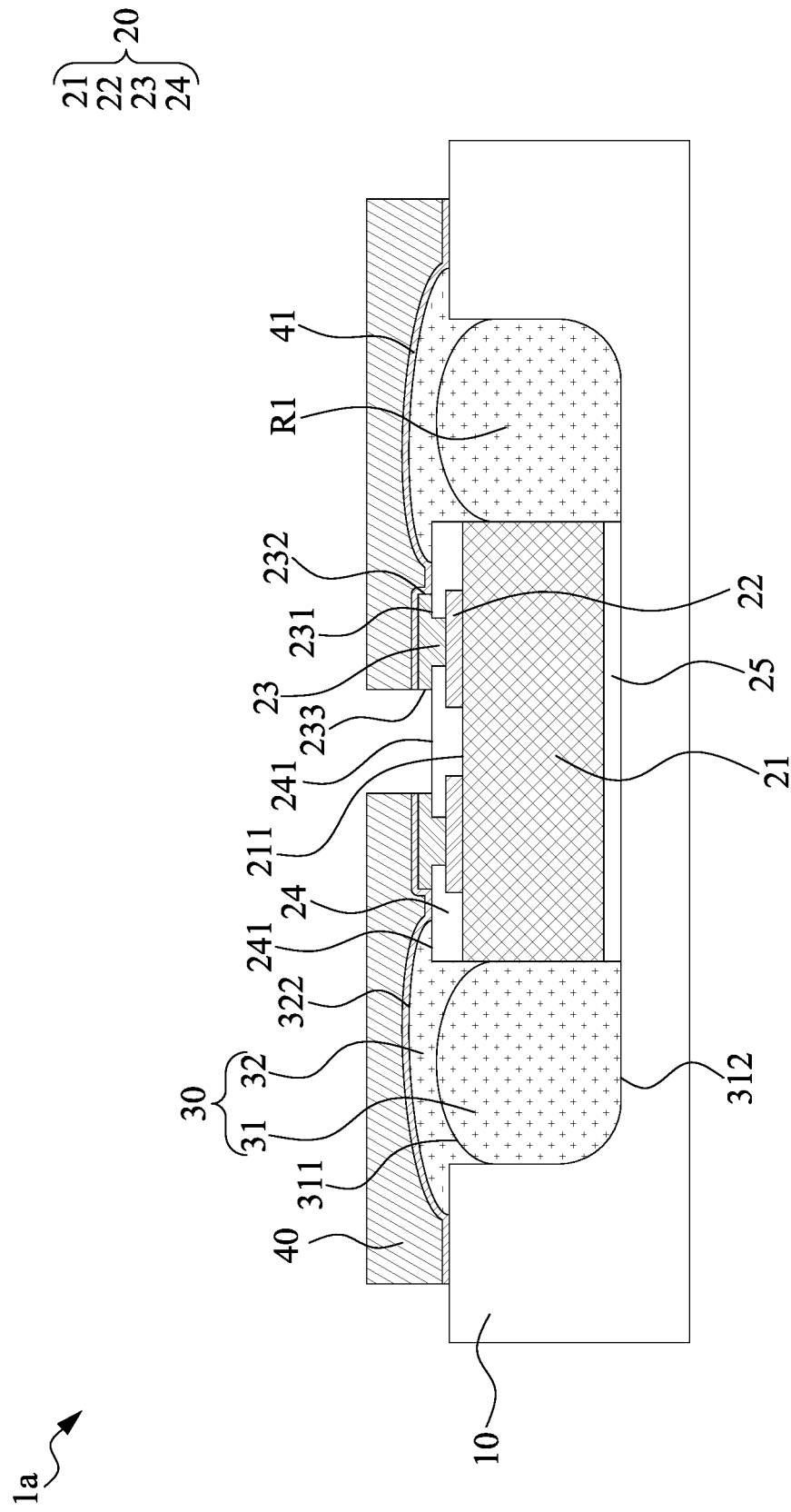

Referring to FIG. 6D, a redistribution structure 40 with a seed layer 41 is formed over the upper surface of the substrate 10, the second dielectric layer 32, the passivation layer 24 and the terminal 23. In some embodiments, a seed layer 41 may be conformally formed on and in contact with the upper surface of the substrate 10, the second dielectric layer 32, the passivation layer 24 and the terminal 23. Then, an electroplating process is performed to form the redistribution structure 40.

Figure 6E:
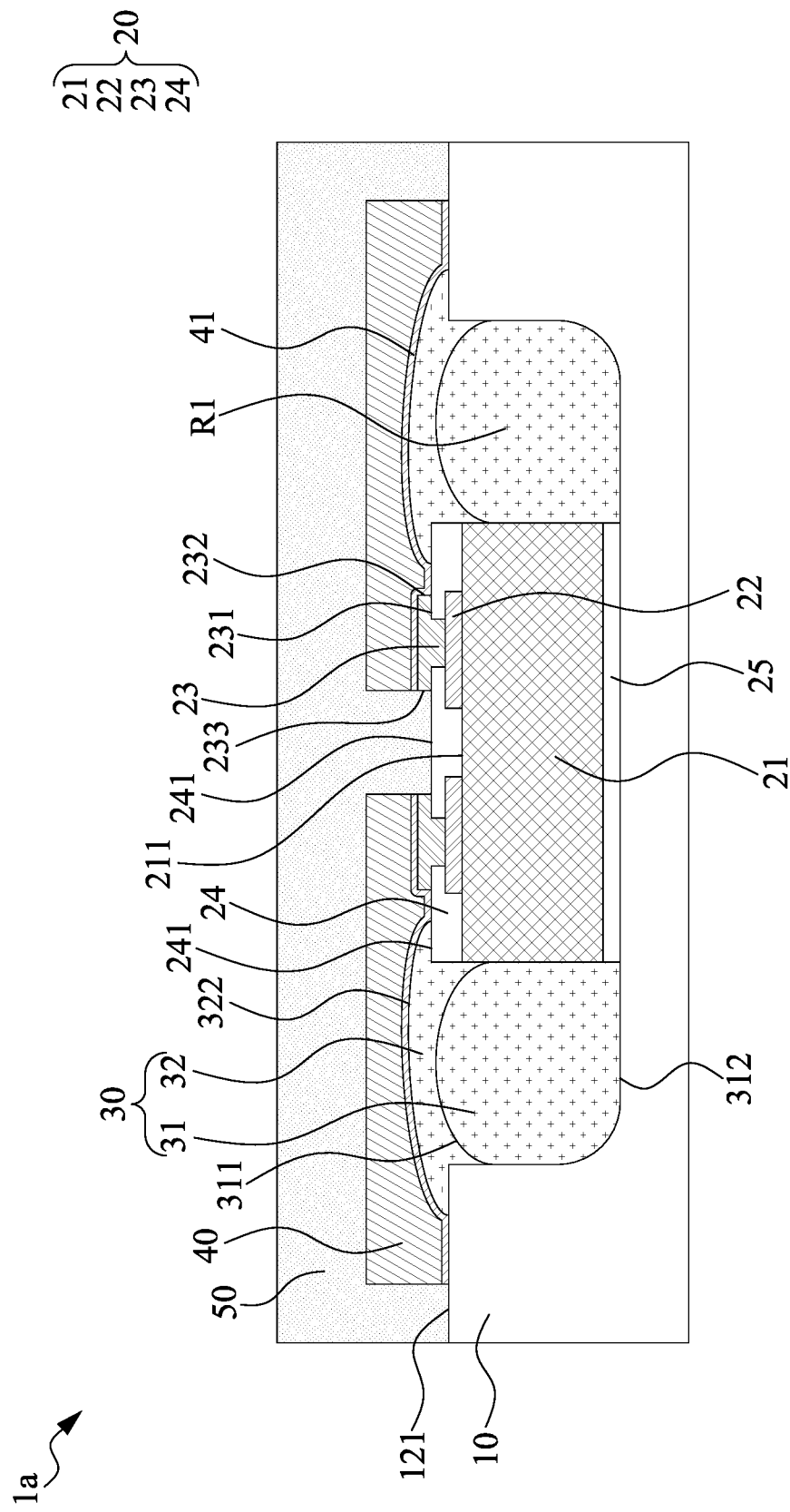

Referring to FIG. 6E, an encapsulant 50 is formed to cover the substrate 10, the dielectric structure 30 and the chip 20. The encapsulant 50 is formed, for example, by molding a compound to encapsulate the substrate 10, the chip 20 and the dielectric structure 30.

Figure 6F:
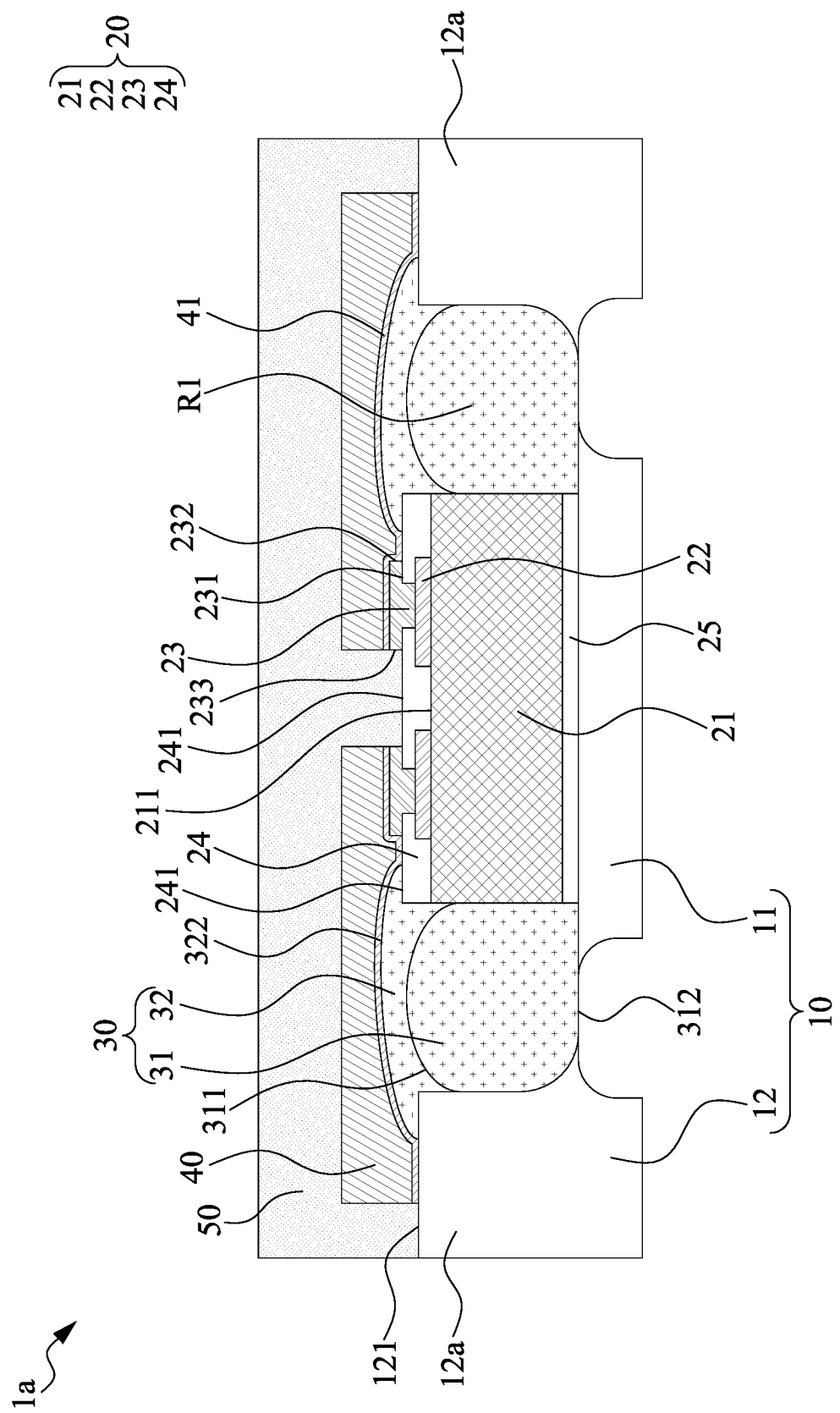

Referring to FIG. 6F, a portion of the substrate 10 is removed such that a first portion 11 and a second portion 12 are formed. As a result, a semiconductor package structure 1a is produced. In this embodiment, the dielectric structure 30 is formed by at least two steps, reducing wedges formed between the dielectric structure 30 and the chip 20. The dielectric structure 30 may provide a relative smooth surface. When the redistribution structure 40 is formed in such a smooth surface, voids may be reduced during the electroplating process. As a result, the yield of manufacturing the semiconductor package structure 1a is improved. In addition, the processes shown in FIGS. 6A-6F may omit formation of a via of the dielectric structure 30. The redistribution structure 40 may be electrically connected to the terminal 23 of the chip 20 without a via.

FIG. 7A, FIG. 7B, FIG. 7C, FIG. 7D, FIG. 7E, FIG. 7F, FIG. 7G, FIG. 7H, FIG. 7I and FIG. 7J illustrate various stages of a method for manufacturing a semiconductor package structure 1c in accordance with some embodiments of the present disclosure.

Figure 7A:
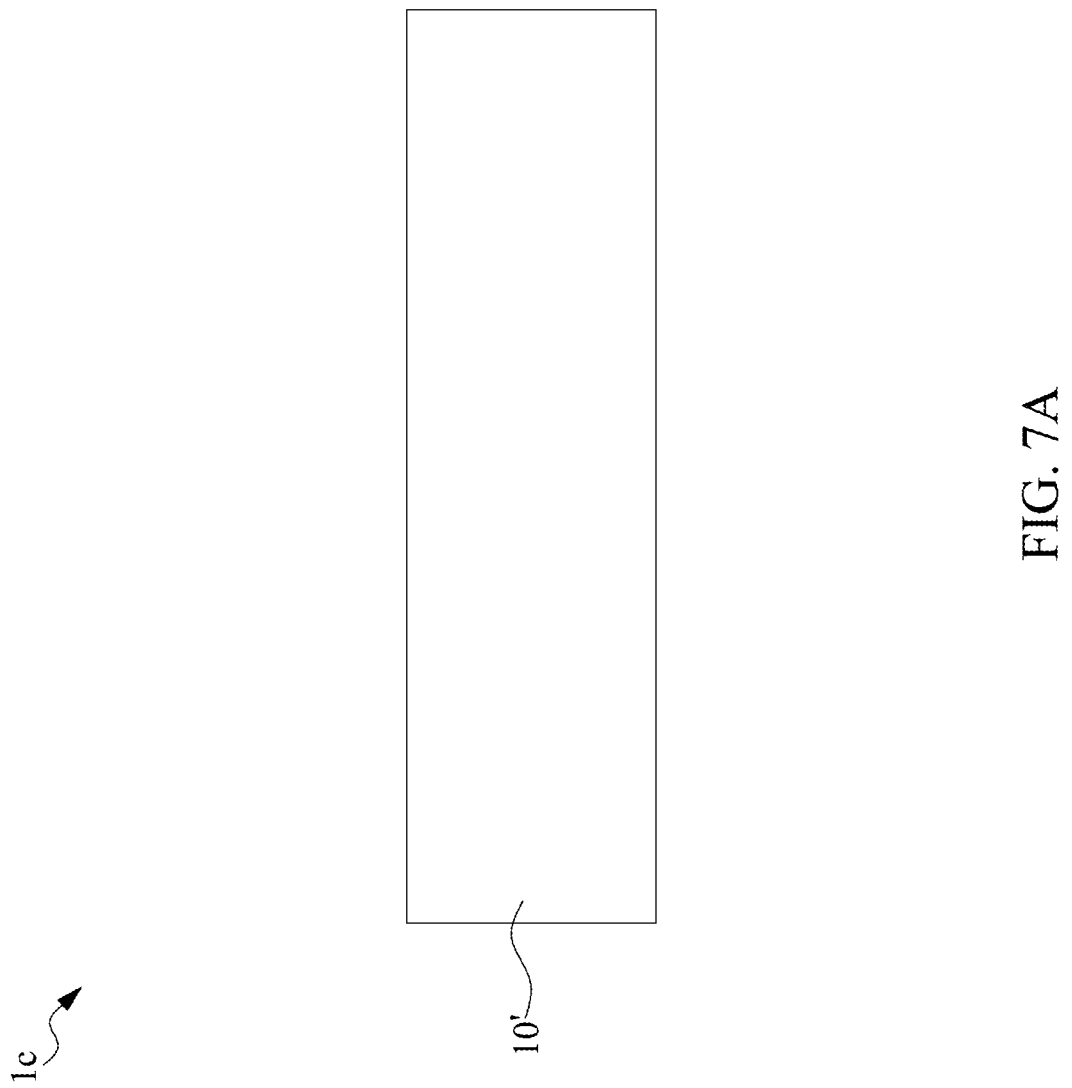
FIG. 7A, FIG. 7B, FIG. 7C, FIG. 7D, FIG. 7E, FIG. 7F, FIG. 7G, FIG. 7H, FIG. 7I and FIG. 7J illustrate various stages of a method for manufacturing a semiconductor package structure in accordance with some embodiments of the present disclosure.

Referring to FIG. 7A, a substrate 10' is provided.

Figure 7B:
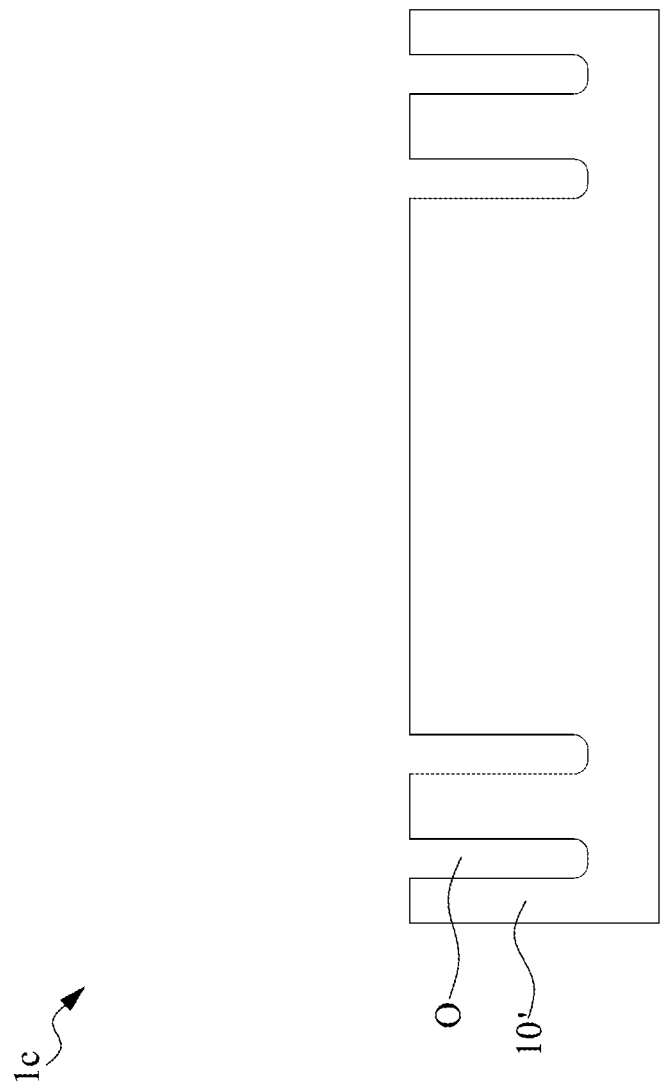

Referring to FIG. 7B, a plurality of openings O are formed. The openings O may be a ring-shaped.

Figure 7C:
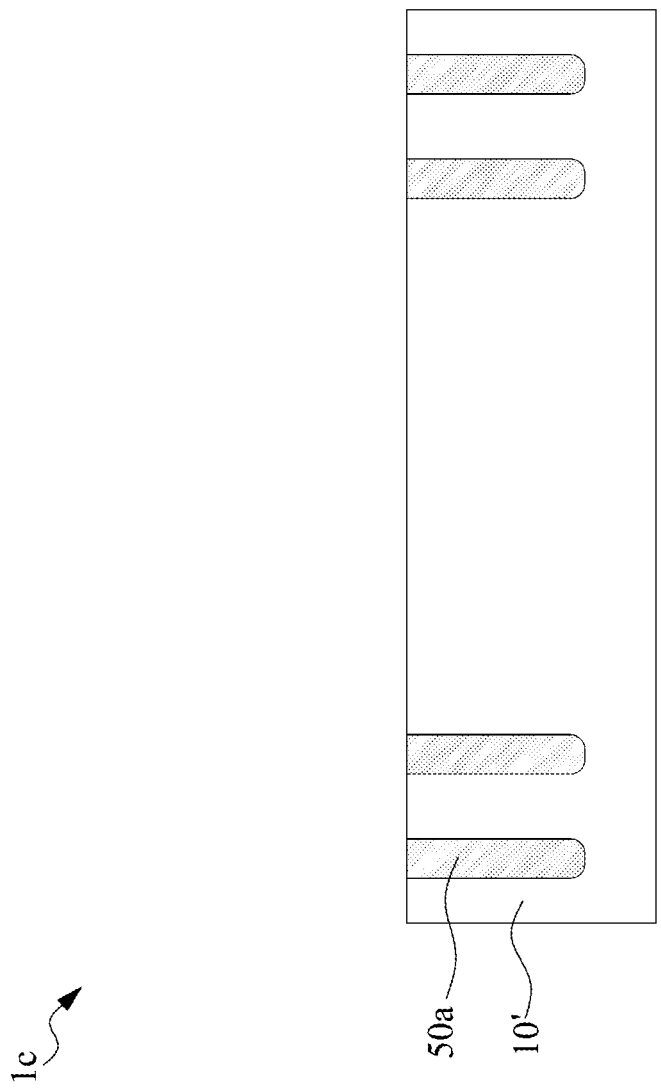

Referring to FIG. 7C, a portion 50a is formed to fill the openings O. The material of the portion 50a may be the same as or similar to that of the encapsulant 50.

Figure 7D:
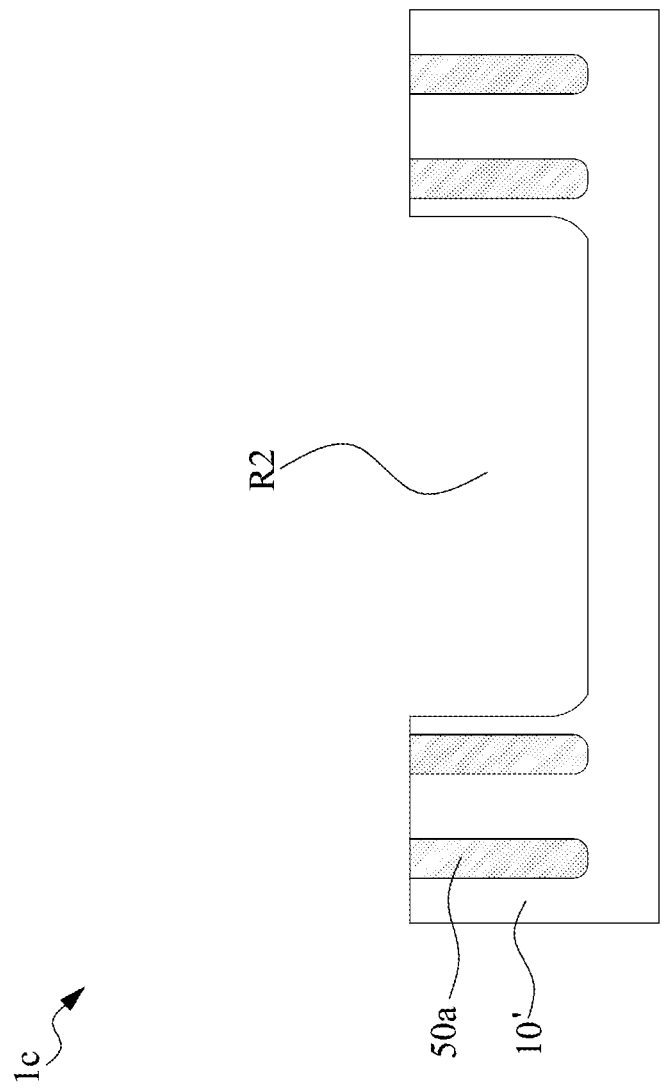

Referring to FIG. 7D, a recess R2 may be formed for accommodating a chip. The portion 50a may surround the recess R2.

Figure 7E:
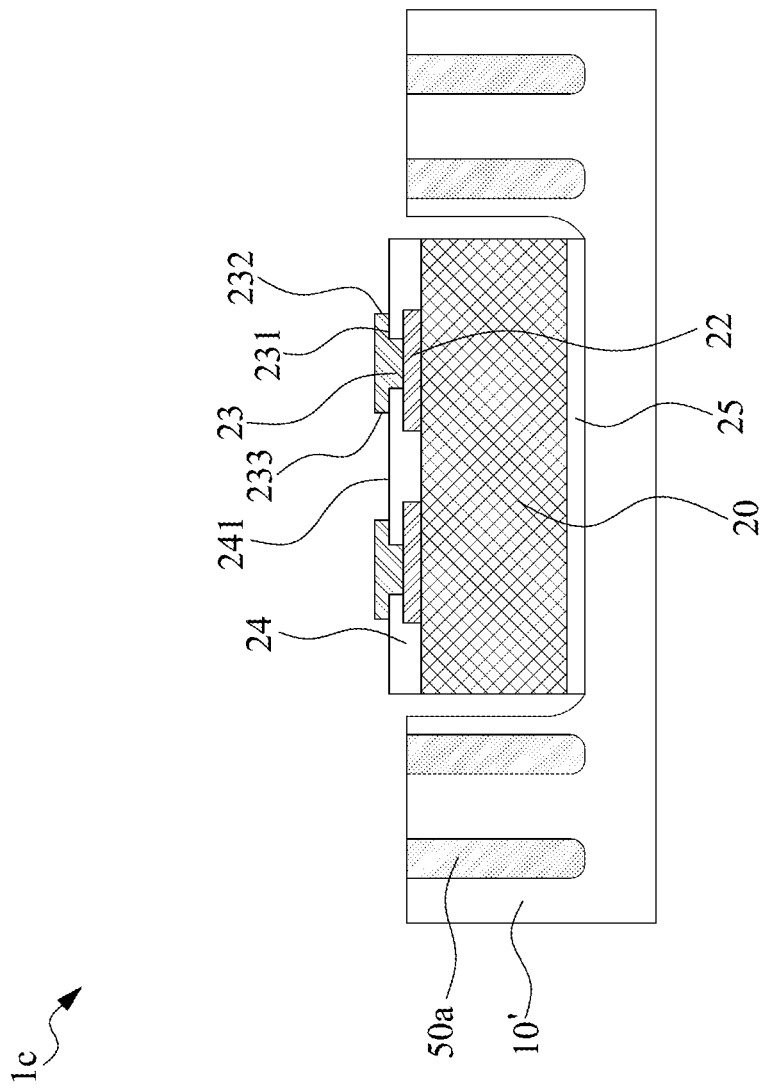

Referring to FIG. 7E, a chip 20 may be attached to the substrate 10' by an adhesive film 25. The chip 20 may be disposed corresponding to the recess R2 of the substrate 10'.

Figure 7F:
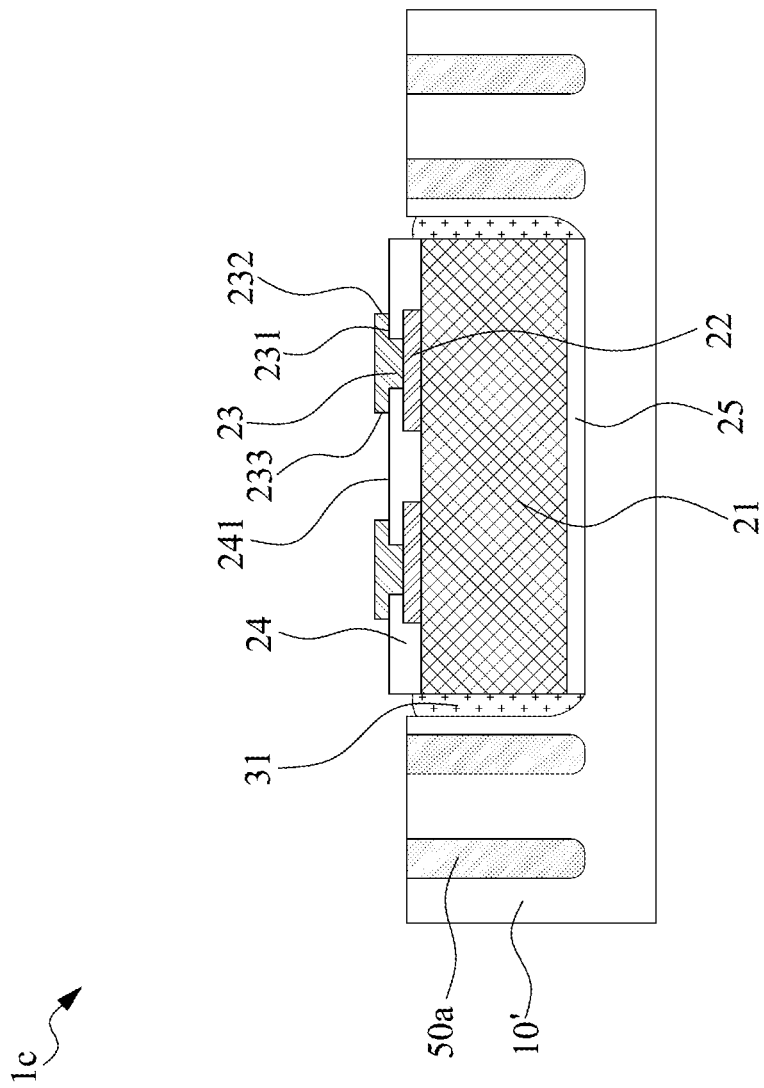

Referring to FIG. 7F, a first dielectric layer 31 is filled into the recess R2 of the substrate 10'. The first dielectric layer 31 is filled into the space between the substrate 10' and the chip 20. In some embodiments, the first dielectric layer 31 may be formed by a screen printing process or a dispensing process. A curing process is performed after filling the first dielectric layer 31.

Figure 7G:
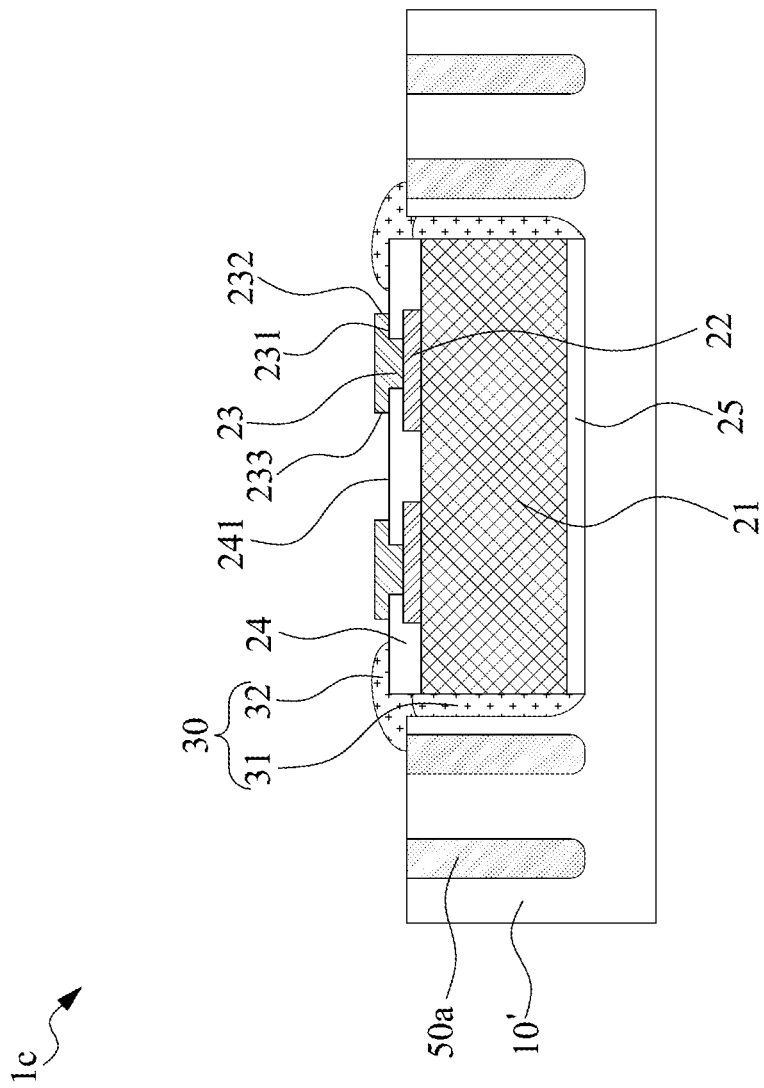

Referring to FIG. 7G, a second dielectric layer 32 is formed over the first dielectric layer 31. The second dielectric layer 32 may cover a portion of the portion 50a. The second dielectric layer 32 may cover the passivation layer 24. In some embodiments, the second dielectric layer 32 may be formed by a dispensing process. An interface is formed between the first dielectric layer 31 and the second dielectric layer 32.

Figure 7H:
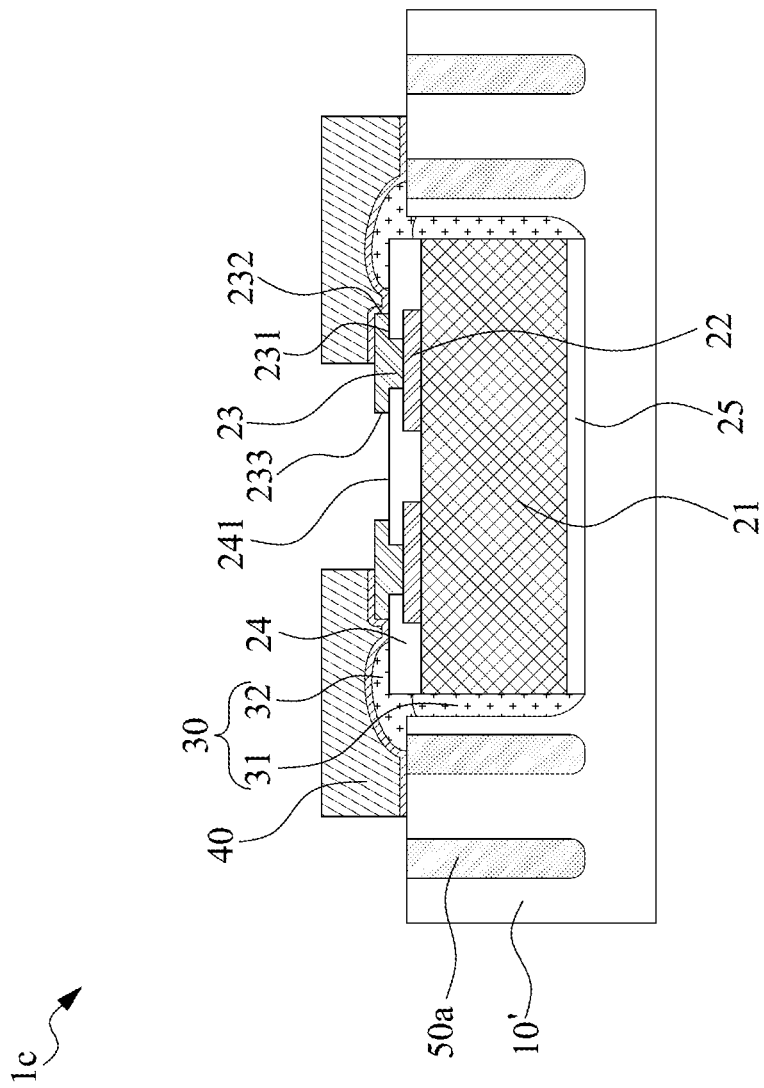

Referring to FIG. 7H, a redistribution structure 40 is formed over the upper surface of the substrate 10', the second dielectric layer 32, the passivation layer 24 and the terminal 23. In some embodiments, a seed layer 41 may be formed on and in contact with the upper surface of the substrate 10', the second dielectric layer 32, the passivation layer 24 and the terminal 23. Next, an electroplating process is performed to form the seed layer 41.

Figure 7I:
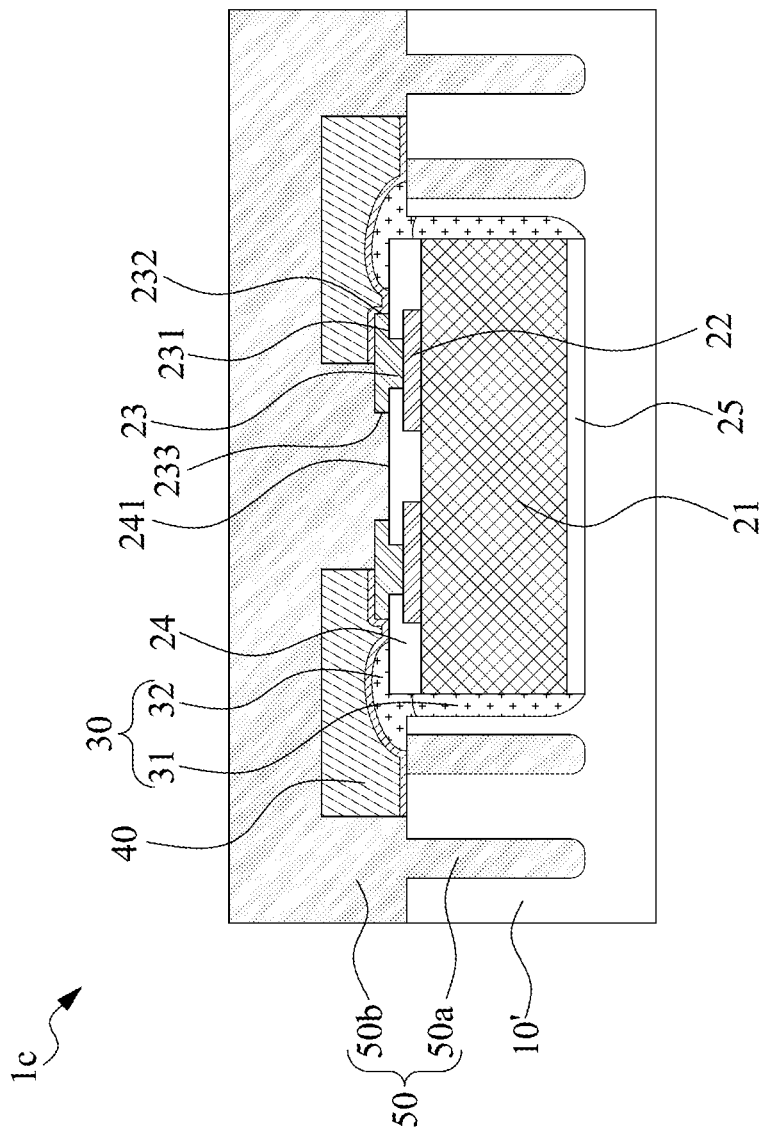

Referring to FIG. 7I, a portion 50b is formed to cover the portion 50a. The portion 50b may encapsulate the substrate 10', the chip 20 and the dielectric structure 30. The portion 50b and the portion 50a may constitute the encapsulant 50.

Figure 7J:
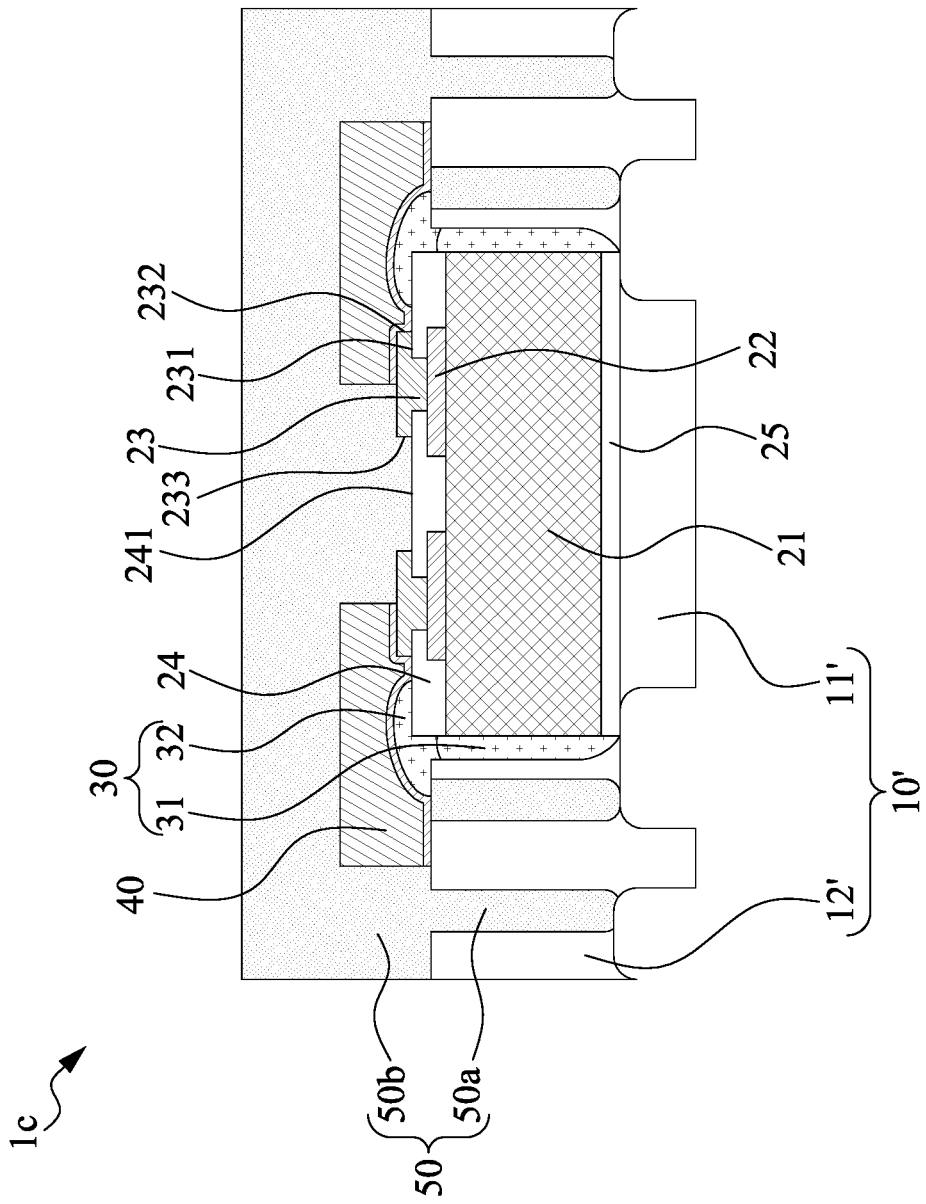

Referring to FIG. 7J, a portion of the substrate 10' is removed such that a first portion 11' and a second portion 12' are formed. As a result, a semiconductor package structure 1c is produced. In this embodiment, the substrate 10' may be a pre-mold lead frame.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of embodiments of this disclosure are not deviated from by such an arrangement.

As used herein, the term "vertical" is used to refer to upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05° For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no exceeding 5 μm, no exceeding 2 μm, no exceeding 1 μm, or no exceeding 0.5 μm. A surface can be deemed to be substantially flat if a displacement between the highest point and the lowest point of the surface is no exceeding 5 μm, no exceeding 2 μm, no exceeding 1 μm, or no exceeding 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity exceeding approximately 104 S/m, such as at least 105 S/m or at least 106 S/m. The electrical conductivity of a material ca sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
    a lead frame comprising a die paddle, a vertical portion around the die paddle, and a lead spaced apart from the vertical portion, the lead frame defining a cavity;
    a chip disposed within the cavity;
    a dielectric structure disposed within the cavity and covering an upper surface of the chip and an upper surface of the vertical portion; and
    an encapsulant in contact with the chip and the lead, wherein the encapsulant is disposed between the vertical portion and the lead,
    wherein the lead comprises a first portion and a second portion spaced apart from the first portion, and the second portion of the lead is disposed between the first portion of the lead and the vertical portion, a bottom surface of the second portion of the lead is substantially coplanar with a bottom surface of the die paddle, and the lead frame has a recess recessed from the bottom surface of the second portion and the bottom surface of the die paddle, and the encapsulant is exposed from the recess, and a lateral side of the second portion of the lead has a first curved surface facing the cavity and a second curved surface facing the die paddle.

2. The semiconductor package structure of claim 1, wherein the dielectric structure extends over the encapsulant.

3. The semiconductor package structure of claim 2, further comprising:
    a seed layer disposed over the dielectric structure and extending over the encapsulant, wherein the seed layer extends over the second portion of the lead.

4. The semiconductor package structure of claim 3, wherein a first part of the second portion of the lead is covered by the seed layer, and a second part of the second portion of the lead is covered by the encapsulant.

5. The semiconductor package structure of claim 1, wherein an intersection of the first curved surface and the second curved surface protrudes toward the die paddle farther than other portions of the lateral side of the second portion of the lead.

6. The semiconductor package structure of claim 5, wherein the intersection is substantially leveled with a surface of the encapsulant exposed from the recess.

* * * * *